(12) United States Patent
Takahashi et al.

(10) Patent No.: US 7,054,224 B2
(45) Date of Patent: May 30, 2006

(54) NON-SYNCHRONOUS SEMICONDUCTOR MEMORY DEVICE HAVING PAGE MODE READ/WRITE

(75) Inventors: Hiroyuki Takahashi, Kanagawa (JP); Hideo Inaba, Kanagawa (JP); Atsushi Nakagawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/478,369

(22) PCT Filed: May 23, 2002

(86) PCT No.: PCT/JP02/05023

§ 371 (c)(1),
(2), (4) Date: Apr. 26, 2004

(87) PCT Pub. No.: WO02/095760

PCT Pub. Date: Nov. 28, 2002

(65) Prior Publication Data

US 2004/0170081 A1  Sep. 2, 2004

(30) Foreign Application Priority Data

May 24, 2001  (JP) .............................. 2001-155523

(51) Int. Cl.
*G11C 8/00* (2006.01)
(52) U.S. Cl. .............................. 365/233.5; 365/189.02; 365/238.5
(58) Field of Classification Search ....... 365/189.02 X, 365/189.05, 233.5 O, 238.5 X
See application file for complete search history.

(56) References Cited

U.S. PATENT DOCUMENTS

| 4,575,825 | A | * | 3/1986 | Ozaki et al. ................. 365/193 |
| 5,404,327 | A | * | 4/1995 | Houston ..................... 365/203 |
| 5,619,473 | A | * | 4/1997 | Hotta ....................... 365/238.5 |
| 5,825,709 | A | * | 10/1998 | Kobayashi ............. 365/230.03 |
| 6,337,810 | B1 | | 1/2002 | Yamasaki et al. |
| 6,629,224 | B1 | | 9/2003 | Suzuki et al. |

FOREIGN PATENT DOCUMENTS

| JP | 59-3790 | 1/1984 |
| JP | 63-46697 | 2/1988 |
| JP | 1-94593 | 4/1989 |
| JP | 8-203274 | 8/1996 |
| JP | 2001-28190 | 1/2001 |
| JP | 2001-118395 | 4/2001 |

* cited by examiner

*Primary Examiner*—VanThu Nguyen
(74) *Attorney, Agent, or Firm*—Muirhead and Saturnelli, LLC

(57) ABSTRACT

The present invention provides a non-synchronous semiconductor memory device configured as a pseudo-SRAM and capable of relaxing the limitation to address skew and improving the read rate. A data latch circuit 110 holds data having been read out of memory cells in a memory cell array 106 designated by a tow address included in an address ADD in a read mode. Upon transitions of column addresses A0, A1 included in the address, a multiplexer 111 sequentially and non-synchronously feeds out the data held in the data latch circuit 110 based on the column addresses A0, A1.

7 Claims, 14 Drawing Sheets

FIG.4
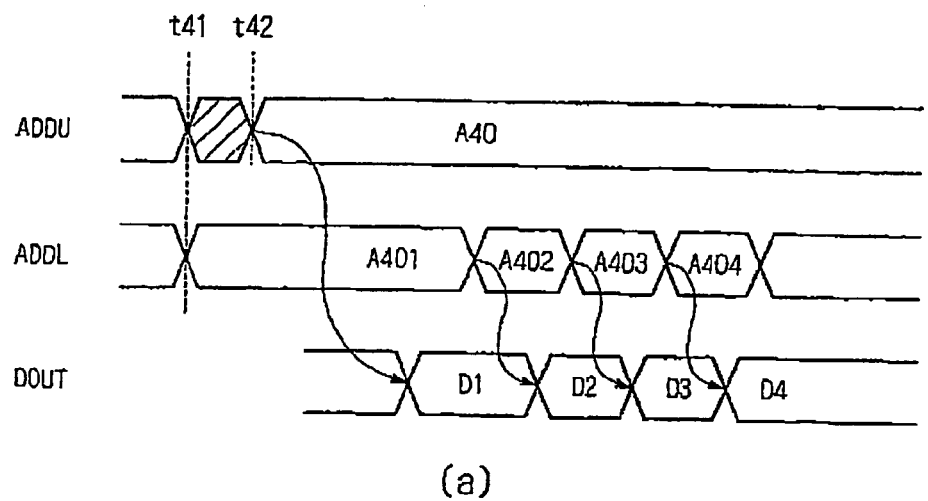
(a)
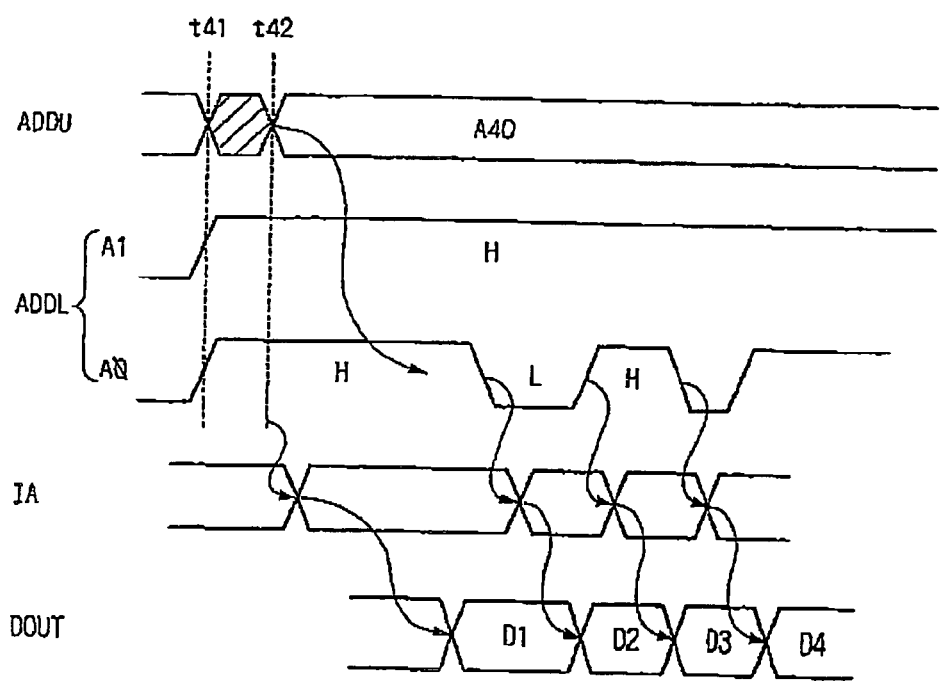
(b)

FIG.14
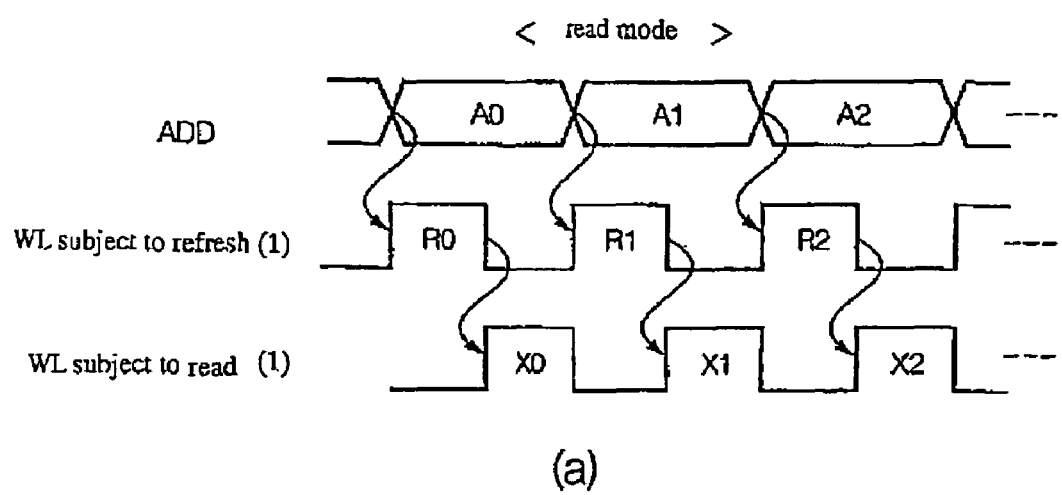
(a)
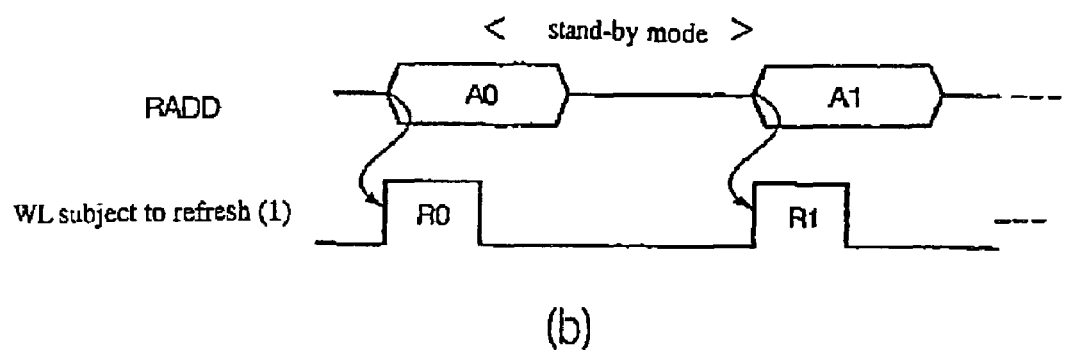
(b)

NON-SYNCHRONOUS SEMICONDUCTOR MEMORY DEVICE HAVING PAGE MODE READ/WRITE

TECHNICAL FIELD

The present invention relates to a non-synchronous semiconductor memory device such as a pseudo-SRAM (Static Random Access Memory) configured to have a basic element of a DRAM (Dynamic Random Access Memory), and more particularly to a semiconductor memory device having a page mode.

BACKGROUND OF THE ART

A pseudo-SRAM has been known, which has a basic element of DRAM and is configured to be so operated as SRAM. The pseudo-SRAM is non-synchronous in view of the specification, which is similar to the conventional SRAM. The pseudo-SRAM is configured to have a basic element of DRAM. The pseudo-SRAM is so configured that operations such as refresh being unique to DRAM are automatically performed by the inside thereof.

An example of the conventional non-synchronous semiconductor memory device configured to have a basic element of DRAM will hereinafter be described.

FIG. 13 shows an example of a configuration of the semiconductor memory device of this type. In this drawing, an address ADD is a signal given from the outside, and includes a row address designating a row of a memory cell array to be described below and a column address designating a column thereof.

An address input system 1 latches the address ADD and outputs an internal address LADD. An address transition detector circuit (ATD) 2 detects a transition of the internal address LADD and outputs a one-shot pulse signal OSP. An address multiplexer (MUX) 3 outputs, as an address MADD, any one of the internal address LADD and a refresh address RADD to be described below.

A row decoder 60 decodes the address MADD for selecting a row of a memory cell array 70. The memory cell array 70 comprises a matrix array of memory cells similarly to the general-purpose DRAM. A sense amplifier 71 amplifies a data signal on a bit line for a read operation. A column decoder 72 selects a column of the memory cell array 70. A pre-charge circuit (not illustrated) for bit lines is provided accompanying to the sense amplifier 71.

A refresh timer circuit 8G times a refresh time interval A refresh control circuit 8H controls a series of refresh operations and generates a refresh control signal REFA for controlling a refresh timing accompanying to an external access and a refresh control signal REFB for controlling a self-refresh dining.

A refresh address generator circuit 8J generates an address RADD (hereinafter referred to as "refresh address") to be used for a refresh operation. An internal pulse generator circuit 10 generates a row enable signal RE, a sense amplifier enable signal SE, a pre-charge enable signal PE and a column enable signal CE.

Other than the above-described circuits, there are further provided a system of circuits for controlling read and write operations, another system of circuits for generating a substrate potential of the memory cell array and still another system of circuits for read and write operations of data to the memory cell array.

The read and write operations and the refresh operation of the semiconductor memory device of the prior art shown in FIG. 13 will sequentially be described with reference to a timing chart of FIG. 14.

A. Read and Write Operations

A read operation according to an address access will be described as one example. In this case, a chip select signal /CS and an output enable signal /OE are set at a low level, while a write enable signal /WE is set at a high level, wherein the address ADD is applied from the outside in accordance with the specification.

The address ADD is taken through the address input system 1 as the internal address LADD. Except for the refresh, this internal address LADD is supplied as the address MADD through the multiplexer 3 to the row decoder 60. At a timing defined by the row enable signal RE, the row decoder 60 selects one word line in the memory cell array 70. Upon selection of the word line, data of memory cells connected to this single row of this word line are read out onto respective bit lines. These data are amplified by the sense amplifier 71 at a timing defined by the sense amplifier enable signal SE.

On the other hand, based on a column address (not illustrated) included in the address ADD, and at a timing defined by the column enable signal CE, the column decoder 72 selects a bit line of the memory cell array 70, so that data on this bit line are supplied through the data output circuit system not illustrated to the outside. Prior to the operation of reading data from the memory cells, bit lines are pre-charged based on the pre-charge enable signal PE In the above-described series of read operations, upon a transition of the internal address LADD, the address transition detector circuit (ATD) 2 detects this transition of the internal address LADD and outputs a one-shot pulse signal OSP. By triggering this one-shot pulse signal OSP, the internal pulse generator circuit 10 outputs, at appropriate timings, the above-described row enable signal RE, the sense amplifier enable signal SE, the pre-charge enable signal PE and the column enable signal CE.

B. Refresh Operation (in Read Mode)

A refresh operation in a read mode will subsequently be described with reference to a ting chart shown in FIG. 14(a).

In the read mode, the semiconductor memory device according to this conventional technique shows a sequential performance of both the refresh operation and the read operation in the same cycle in accordance with the specification.

The address input system 1 latches an address A0 given from the outside as the address ADD and then outputs the internal address LADD. The address transition detector circuit 2 detects a transition of the internal address LADD and outputs the one-shot pulse signal OSP.

Upon receipt of the one-shot pulse signal OSP, the refresh control circuit 8H starts the refresh operation. Upon the start of the refresh operation, the refresh address generator circuit 8J generates and outputs a refresh row address R0 as the refresh address RADD. Under the control of the refresh control circuit 8H, the address multiplexer 3 supplies the refresh address RADD (the refresh Tow address R0) as the address MADD to the row decoder 60.

On the other hand, the internal pulse generator circuit 10 receives an input of the refresh control signal REFB from the refresh control circuit 8H, and outputs the row enable signal RE and the sense amplifier enable signal SE. The row decoder 60 receives inputs of the address MADD and the row enable signal RE and selects a word line designated by the refresh row address R0 for a predetermined time period defined by the row enable signal RE Data signals of the memory cells connected to the selected word line are amplified by the sense amplifiers and then re-stored therein, whereby the data of the memory cells for the single row designated by the refresh row address R0 have been refreshed.

After the refresh operation has been finished for the row designated by the refresh row address R0, then the read operation is made in the same cycle. For example, the address multiplexer 3 receives the internal address LADD from the address input system 1 and supplies the internal address LADD as the address MADD to the row decoder 60. The row decoder 60 selects the word line designated by the row address R0 included in the input address MADD. The sense amplifier 71 amplifies the data signal appearing on the bit line in the memory cell array 70, so that these amplified data are read out.

C. Refresh Operation (in Stand-by Mode)

A refresh operation in a stand-by mode will be described with reference to a timing chart shown in FIG. 14(b).

In the stand-by mode, the refresh control circuit 8H times a past time from a time of a last external request for access, so that if the past time becomes beyond a predetermined refresh time, then the refresh control circuit 8H outputs the refresh control signal REFB to start the self-refresh operation.

For example, in the stand-by mode, the refresh timer circuit 8G times the time interval for the self-refresh operations. At a timing given by the refresh timer circuit 8G, the refresh control circuit 8H causes the refresh address generator circuit 8J to generate the refresh row address R0 as the refresh address RADD. The address multiplexer 3 receives an input of the refresh row address R0 as the refresh address RADD and supplies the refresh row address R0 as the address MADE to the row decoder 60.

On the other hand, the refresh control circuit 8H outputs the refresh control signal REFB so as to cause the internal pulse generator circuit 10 to generate the row enable signal RE at an appropriate timing. The row decoder 60 receives an input of the refresh row address R0 as the address MADD from the address multiplexer 3 and selects a word line designated by the refresh row address R0 at a timing defined by the row enable signal RE for a predetermined period of time. Data signals of the memory cells connected to the selected word line are amplified by the sense amplifiers and then re-stored therein similarly to the above-described read mode. In the stand-by mode, the refresh is made for rows designated by refresh addresses sequentially generated by the refresh address generator circuit 8J in accordance with timings generated by the refresh timer circuit 8G.

For the SRAM, no limitation is present to the address skew externally supplied. There is no regulation for the skew on the specification. For the pseudo-SRAM having the basic element of DRAM, there is an inter-restriction to the timings of the internal circuits, wherein non-limitation to the skew does not guarantee the normal operation. For this reason, in case of the pseudo-SRAM, generally, an upper limit of the skew of the address externally supplied is regulated on the specification in order to provide the skew with a limitation. The user has to take into account that the skew of the address is kept not beyond the regulation value over the specification.

The presence of the limitation over specification to the skew of the address requires the user to set a timing by previously taking into account the skew. This provides a bar to the high rate performance. For example, in case of the page mode of the DRAM, the column addresses only are switched in accordance with the specification. The consideration of the skew for setting the timing of address makes it difficult to set a short cycle of address, whereby a high rate read operation as a characteristic of the page mode is no longer available.

The present invention has been made in view of the above-described circumstances. Accordingly, it is desirable to provide a non-synchronous semiconductor memory device configured as the pseudo-SRAM, which is, however, capable of relaxing the restriction to the skew of address and improving the read rate.

SUMMARY OF THE INVENTION

In order to solve the above-described issue, the present invention has the following constitutions.

The present invention provides a semiconductor memory device configured to initialize a bit line by triggering a transition of an address externally supplied and read out data from a memory cell connected to the bit line, characterized in that, in a read mode, data are read out from memory cells designated by a row address included in said address, and then the data are held, and upon a transition of a column address included in said address, said held data are sequentially and non-synchronously fed out to the outside based on said column address.

The semiconductor memory device is further characterized in that if said address externally supplied is transitioned during a read operation, then a read operation is made again by taking a new external address after said read operation.

The semiconductor memory device is further characterized in that the newly taken address is compared to the previously taken address, and if those addresses are the same as each other, then a read operation for the newly taken address is made null.

The semiconductor memory device is further characterized by further comprising a data latch circuit for holding a plurality of data having read out from said memory cells, a multiplexer for selecting one of said plurality of data held by said data latch circuit, and a control circuit for non-synchronously switching a selection state of said multiplexer based on said column address.

The semiconductor memory device is further characterized in that said plurality of data having read out from said memory cells are taken in time-division into said data latch circuit based on said column address.

The semiconductor memory device is flitier characterized in that if only said column address is transitioned in a write mode, then a plurality of data are externally taken in a plurality of cycles defined by said column addresses, and said plurality of data are stored in memory cells in a last cycle of said plurality of cycles.

The semiconductor memory device is further characterized in that if only said column address is transitioned in a write mode, then a plurality of data are externally taken in a plurality of cycles defined by said column addresses, and said plurality of data are stored in memory cells in late-write.

BRIEF DESCRIPTIONS OF DRAWINGS

FIG. 4 is a timing chart illustrative of operations of the semiconductor memory device (normal operations) in accordance with the first embodiment of the present invention.

FIG. 14 is a timing chart illustrative of operations of the semiconductor memory device of this type.

DETAILED DESCRIPTION OF VARIOUS EMBODIMENTS

Embodiments of the present invention will be described with reference to the drawings.

First Embodiment

The first embodiment of the present invention will be described.

A semiconductor memory device in accordance with the first embodiment is a pseudo-SRAM which is configured to initialize a bit line by triggering a transition of an address externally supplied and read out data from a memory cell connected to the bit line. The semiconductor memory device uses the same memory cells as DRAM and operates in accordance with the same specification as the normal SRAM. The semiconductor memory device has a non-synchronous data read operation mode upon transition of the column address only. This operation mode is similar to a page mode of DRAM in view that only the column address is switched for read out operation, for which reason this operation mode will be referred to as a page mode. In contrast, an operation mode synchronizing with any optional address similar to the prior art will be referred to as a normal mode.

Similarly to the above-described prior art, the semiconductor memory device in accordance with the first embodiment is so configured as to detect transitions of externally entered address and chip select signal for internally generating a pulse signal, so that a refresh operation and a read write operation are sequentially made in the same cycle by triggering this pulse signal, as well as perform a self-refresh at predetermined timings from a timer in a stand-by mode.

Figure 1:
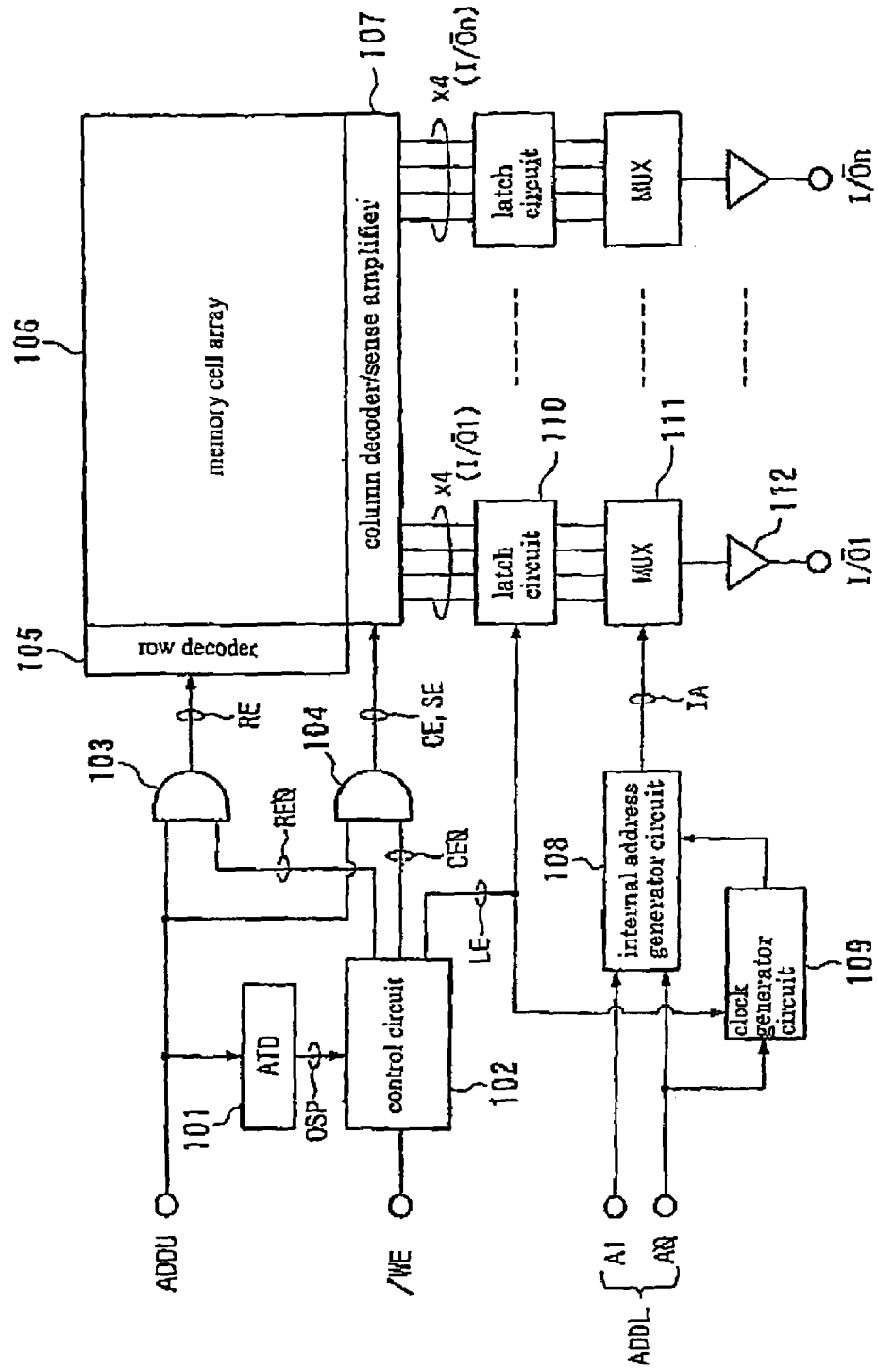
FIG. 1 is a block diagram illustrative of a configuration of a semiconductor memory device in accordance with a first embodiment of the present invention.

FIG. 1 schematically shows a whole configuration of the semiconductor memory device of this embodiment.

In this drawing, an address ADDU is an upper address given from the outside to this semiconductor memory device, and includes row addresses and a part of column addresses. An address ADDL is a lower address given from the outside to this semiconductor memory device, and includes remaking column addresses A0 and A1 which are not included in the above-described upper address ADDU. Externally given signals other than those addresses include a chip select signal /CS (not illustrated), a write enable signal /WE and an output enable signal /OE (not illustrated).

The chip select signal /CS is a most significant control signal for controlling an operation state of the semiconductor memory device. A high level of the chip select signal /CS places the semiconductor memory device into a stand-by mode. A low level of the chip select signal /CS places the semiconductor memory device into an active mode (a read mode or a write mode). The write enable signal /WE is a control signal for switching the read mode and the write mode. The output enable signal /OE is a control signal for controlling an output state (an impedance state) of a buffer circuit for outputting data In the drawing, an address transition detector circuit (ATD) 101 detects a transition of the upper address ADDU and outputs a one-shot pulse signal OSP. Each bit of the upper address ADDU is subject to the transition detection. If any bit of the upper address ADDU is transitioned, then the one-shot pulse signal OSP is outputted.

Even illustration is not made, the address transition detector circuit (ATD) 101 is so configured that a path for generating a one-shot pulse signal to be used for starting refresh is different in the characteristic of response to the address transition from another path for generating another one-shot pulse signal to be used for starting read. For example, a filter utilizing a delay circuit is used so that the path for generating the one-shot pulse signal to be used for starting refresh is highly sensitive, while the other path for generating other one-shot pulse signal to be used for starting read is lowly sensitive, thereby effectively preventing any erroneous operation due to a noise included in the address.

A control circuit 102 controls timings of a variety of internal signals in response to the write enable signal /WE and the one-shot pulse signal OSP. The control circuit 102 outputs signals RE0, CE0, which provide timings of activating a row address signal RE, a column address signal CE and a sense amplifier enable signal SE, as well as outputs a latch enable signal LE, which provides a timing of latching data which had read out from the memory cells.

A gate circuit 103 has a function as a pre-decoder for pre-decoding a row address included in the upper address ADDU, and for outputting the row address signal RE at a predetermined timing. The gate circuit 103 also has another function of selecting and outputting, at an appropriate timing, a row address for refresh, instead of the row address included in the address ADDU.

A gate circuit 104 has a function as a pre-decoder for pre-decoding a column address (excluding A0, A1) included in the upper address ADDU, and for outputting a column address signal CE and a sense amplifier enable signal SE at a predetermined timing. In a refresh mode, the gate circuit 104 holds the column address signal CE in an inactive state, thereby placing all of the bit lines into a non-selected state. If a memory cell array 106 comprises a plurality of divided blocks, then the gate circuit 104 activates and outputs only a column address for refresh for selecting the block in the refresh mode.

A row decoder 105 receives an input of the row address signal RE outputted from the above-described gate circuit 103 and drives exclusively a word line in the memory cell array. The memory cell array 106 comprises a matrix array of memory cells (including a single capacitor and a single transistor) which includes a data storage capacitor. Word lines and bit lines (bit line pairs) run in row and column directions, respectively.

A column decoder/sense amplifier 107 includes a sense amplifier for amplifying a data signal on a bit line, which had been read out from the memory cell array 106, and a column decoder for selecting a bit line which is subject to the read operation. The column decoder selects a bit line based on the column address signal CE outputted from the above-described gate circuit 104. In the read mode, the sense amplifier amplifies data under the control of the sense amplifier enable signal SE. In the refresh mode, the sense amplifier is used for restoring data once stored in the memory cell.

An internal address generator circuit 108 decodes column addresses A0, A1 as lower addresses included in the address externally supplied and generates an internal address IA. A clock generator circuit 109 generates a clock pulse upon a transition of the column address A0 only. The above-described internal address generator circuit 108 has a function of sequential increments of the internal address IA upon receipts of inputs of the clock pulse from the clock generator circuit 109.

A data latch circuit 110 latches the data selected by the column decoder/sense amplifier 107, based on the latch enable signal LE. In this example, "n" of data latch circuits are provided in correspondence to data terminals I/O1~I/On. Each data latch circuit latches 4 bits data (plural data) given from, a column decoder side. A multiplexer (MUX) 111 sequentially selects respective ones of the four-bits data latched by the data latch circuit 110, based on the internal address IA, and outputs the same in time-division. An output buffer 112 feeds out the data from the multiplexer 111 to the outside.

Even illustration is not made, this semiconductor memory device includes an address input circuit for latching and taking the externally supplied address ADD into the inside of the device. The address taken into this address input circuit is then supplied to the address transition detector circuit 101 and the gate circuits 103 and 104. Similarly to the conventional semiconductor memory device as described above, there are also provided necessary configurations for performing as the pseudo-SRAM such as a circuit system for performing a refresh in the same cycle of the read/write operation, and a circuit system for pre-charging the bit line.

Figure 2:
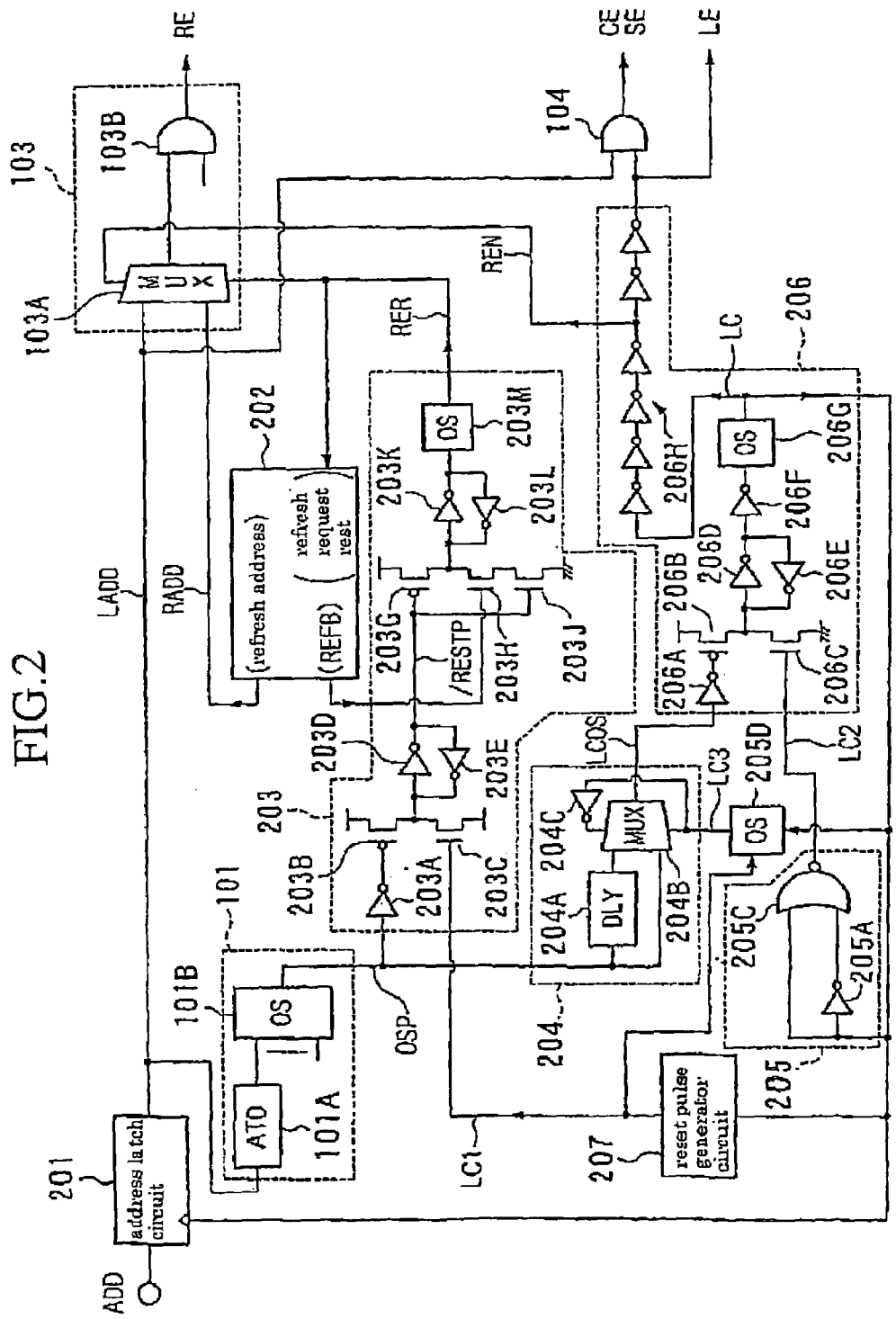
FIG. 2 is a block diagram illustrative of a detailed configuration of the semiconductor memory device in accordance with the first embodiment of the present invention

FIG. 2 shows a configuration of the circuit system for eliminating the restriction or limitation to the skew as a feature of the first embodiment This circuit system is configured to latch again the address if the address was latched in the skew cycle.

In this drawing, the common structural elements to FIG. 1 are provided with the same reference numbers.

In this drawing, an address latch circuit 201 takes and latches the externally supplied address ADD based on a latch signal, and outputs the same as an internal address LADD. The address transition detector circuit 101 comprises a detector unit 101A for detecting a transition of each bit of the address and a pulse generator unit 101B for generating a one-shot pulse OSP upon receipt of an output from the detector unit 101A The detector unit 101A is provided for each bit of the address ADD. The output from the detector unit is inputted into the pulse generator unit 101B. The pulse generator unit 101B outputs the one-shot pulse OSP upon transition of any bit of the address ADD.

The gate circuit 103 comprises a multiplexer (MUX 103A and a decoder circuit 103B. The multiplexer 103A is provided for each bit of the address ADD. The multiplexer 103A selects and outputs the internal address LADD or the refresh address RADD. The decoder circuit 103B pre-decodes the address LADD selected by the multiplexer 103A and outputs the row address signal RE.

A refresh control circuit 202 has an integration of a refresh timer, which times a time interval of the refresh. The refresh control circuit 202 performs a series of processes for controlling the self-refresh operations, based on the one-shot pulse signal outputted from the above-described address transition detector circuit 101. For example, if a past time from the last external access becomes beyond a predetermined refresh time, then the refresh control circuit 202 starts the self-refresh operation, and generates and outputs the refresh address RADD. The refresh timer is reset every time the one-shot pulse OSP is outputted, and re-starts the timing operation.

The refresh control circuit 202 generates the refresh control signal for controlling the timing of the refresh operation. There are the following two kinds of refresh control method in the active mode. In this embodiment, the second refresh control method is used.

(a) The First Refresh Control Method

The refresh control circuit 202 generates a refresh control signal REFA (not illustrated), so that a refresh enable state is set by the refresh control signal REFA, whereby the refresh is started by triggering the subsequent address transition.

(b) The Second Refresh Control Method

The refresh control circuit 202 generates a refresh control signal REFB, whereby the refresh is started by triggering the internal refresh timer based on the refresh control signal REFB.

A critical state, that the refresh operation is closest to the read/write operation, appears in a case that tho address transition appears immediately after the start of the refresh in accordance with the second refresh control method. In this case, the read/write operation follows to the refresh operation, for which reason the second refresh control method is substantially different from the first refresh control method. In this embodiment, the above-described difference of the refresh control methods does not sense. The present invention is applicable to either the refresh control methods.

A refresh address select control circuit 203 receives the above-described refresh control signal REFB, and controls the above-described gate circuit 103 for selecting the refresh address RADD, wherein the selected state is maintained until the one-shot pulse signal OSP is generated. This refresh address select control circuit 203 comprises an inverter 203A, a p-type MOS transistor 203B, an n-type MOS transistor 203C, inverters 203D, 203E, a p-type MOS transistor 203G, an n-type MOS transistor 203H, 203J, inverters 203K, 203L and a one-shot pulse generator circuit (OS) 203M.

The inverter 203A, the p-type MOS transistor 203B, the n-type MOS transistor 203C, and the inverters 203D, 203E form a latch circuit for latching the one-shot pulse signal OSP. This latch circuit is reset by a signal LC1. The p-type MOS transistor 203G, the n-type MOS transistor 203H, 203J, and the inverters 203K, 203L form another latch circuit for latching the refresh control signal REFB. This latch circuit is reset by an output from the above-described latch circuit for latching the one-shot pulse signal OSP.

In accordance with this refresh address select control circuit 203, upon output of the refresh control signal REFB from the refresh control circuit 202, the level of this signal is held by a flip-flop circuit comprising the inverters 203K and 203L, so that upon receipt of a transition, at this time, of an output from the inverter 203K, the one-shot pulse generator circuit 203M generates one-shot pulse as a signal RER having a predetermined pulse width. Upon generation of the one-shot pulse OSP, another flip-flop comprising the inverters 203D and 203E is set, whereby still another flip-flop comprising the inverters 203K and 203L is reset. Upon generation of the signal LC1, yet another flip-flop comprising the inverters 203D and 203E is reset.

A timing adjuster circuit 204 adjusts the timing of the one-shot pulse OSP. The tiring adjuster circuit 204 comprises a delay circuit (DLY) 204A, a multiplexer (MUX) 204B, and an inverter 204C. One input of the multiplexer 204B is supplied with the delayed one-shot pulse OSP delayed by the delay circuit 204A, while another input thereof is supplied with the non-delayed one-shot pulse OSP. The inverter 204C is to provide an inversion signal of a signal LC3 for controlling the selection state of the multiplexer 204B. A selected signal (the one-shot pulse signal OSP or the delayed signal thereof) selected by the multiplexer 204B is outputted as a si LCOS.

A reset pulse generator circuit 205 comprises an inverter 205A, a NOR-gate 205C, and a one-shot pulse generator circuit (OS) 205D. The inverter 205A and the NOR-gate 205C form a circuit for detecting a fall of the signal LC outputted from a late-described latch signal generator circuit and generating a high level of a pulse signal LC2. This signal LC2 is supplied to the one-shot pulse generator circuit 205D for resetting the one-shot pulse generator circuit 205D. A reset pulse generator circuit 207 is configured similarly to the reset pulse generator circuit 205.

A latch signal generator circuit 206 comprises an inverter 206A, a p-type MOS transistor 206B, an n-type MOS transistor 206C, inverters 206D, 206E, 206F, a one-shot pulse generator circuit 206G, and an inverter chain 206H. The inverter 206A, the p-type MOS transistor 206B, the n-type MOS transistor 206C and the inverters 206D, 206E and 206F form an RS-flip-flop. An output from this flip-flop is supplied to the one-shot pulse generator circuit 206G. An output from this one-shot pulse generator circuit is supplied to the inverter chain 206H.

In accordance with this latch signal generator circuit 206, a latch signal LC is generated upon receipt of the above-described signal LCOS and then supplied to the address latch circuit 201. The signal LC is then subjected to a timing adjustment by the inverter chain 206H and outputted as a signal REN and a latch enable signal LE. At this time, the signal LCOS is held by the flip-flop comprising the inverters 206D and 206E, and the latch signal LC is maintained in the active state. The flip-flop is reset by a signal from the reset pulse generator circuit 205, whereby the latch signal LC is inactivated.

Figure 3:
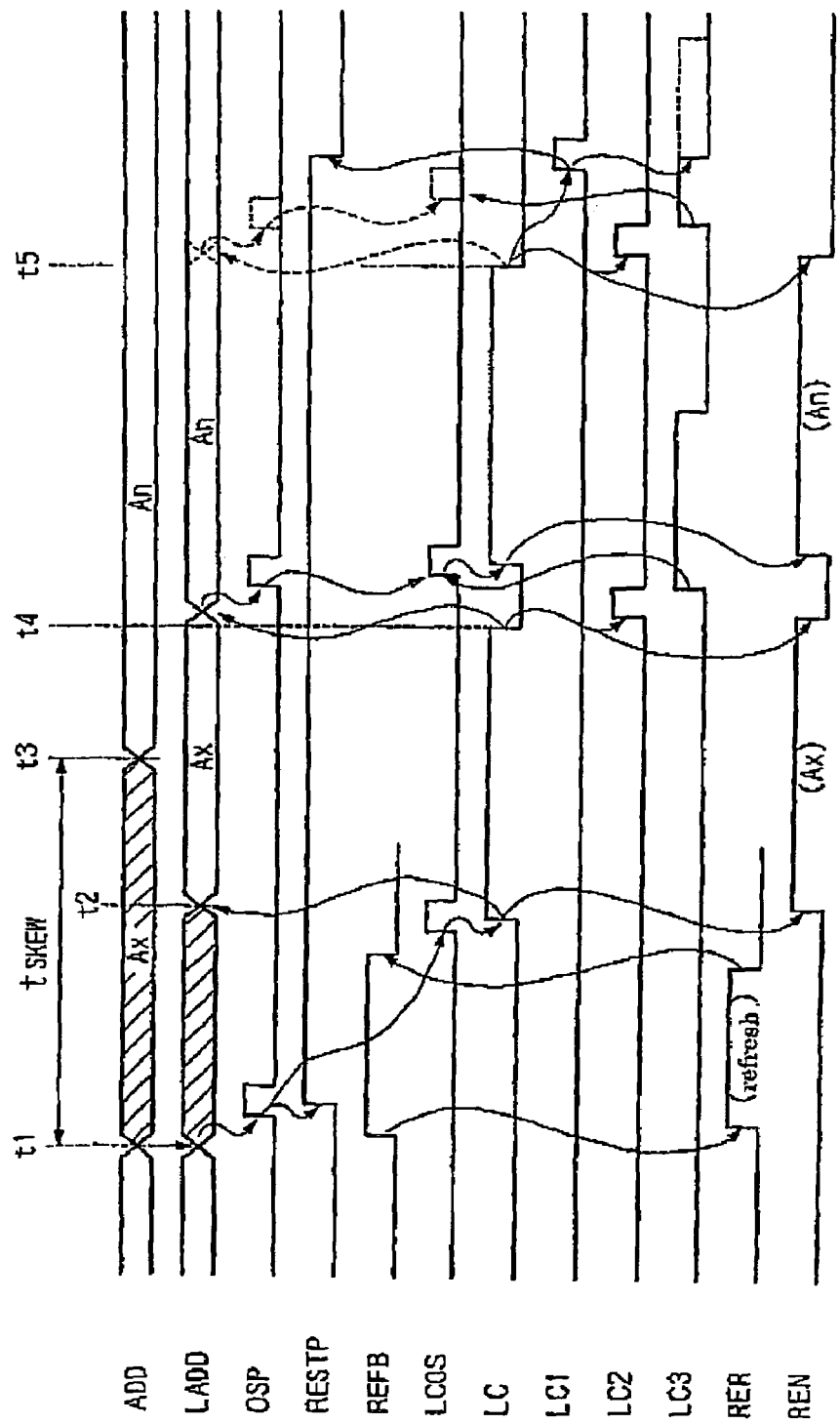
FIG. 3 is a timing chart illustrative of operations of the semiconductor memory device (operations of the system of circuits shown in FIG. 2) in accordance with the first embodiment of the present invention.

An entire operation of the circuit system shown in FIG. 2 will be described with reference to FIG. 3. In FIG. 3, a signal RESTP represents an inversion signal of a signal /RESTP shown in FIG. 2.

As described below, in accordance with this circuit configuration, there is no address skew time period, whereby even if an erroneous address is latched, then an address is latched again to prevent any malfunction.

In FIG. 3, the address ADD is transitioned at a time t1, and defined at a time t3 which is later than a time t2 of generating the latch signal LC. Accordingly, a time period from the time t1 to the time t3 is a skew time period tSKEW.

At the time t1, the address ADD is first-transitioned, whereby the address transition detector circuit 101 detects this address transition and generates a one-shot pulse signal OSP. Upon receipt of this one-shot pulse signal OSP, then the refresh address select control circuit 203 generates a refresh disable signal RESTP to hold the signal RER in the inactive state. If the activation of the refresh control signal REFB is caused after the activation of the refresh disable signal RESTP, then the refresh address RADD is not selected and a new self-refresh is inhibited.

The one-shot pulse signal OSP is delayed by the delay circuit 204A of the timing adjuster circuit 204, and then outputted as the one-shot pulse signal LCOS from the multiplexer 204C. The one-shot pulse signal OSP is held in the flip-flop (comprising the inverters 206D, 206E) in the latch signal generator circuit 206. Upon rising edge of the one-shot pulse signal LCOS, the latch signal LC is outputted from the latch signal generator circuit 206.

As described above, the fist transition of the address ADD causes that the one-shot pulse signal OSP delayed by the delay circuit 204A is selected as the one-shot pulse signal LCOS, and the latch signal LC is outputted with a predetermined time delay from the address transition at the time t1. The reason why the timing of generating the latch signal LC is delayed is to avoid any confliction with the refresh in case that as shown in FIG. 3, the refresh control signal for starting the self-refresh is generated, while the read operation is about to be made upon the transition of the address ADD.

The latch signal outputted from the latch signal generator circuit 206 is supplied to the address latch circuit 201, whereby the address ADD is latched at the time t2.

In this example, at the time t2, the address ADD is in the skew time period and in the indefinite state, for which reason similarly to the above-described conventional semiconductor memory device, the address latch circuit 201 latches an indefinite address Ax as the internal address LADD. At the tie t3, the skew time period tSKEW is terminated, whereby the address ADD is defined.

At a time t4 when a predetermined time has past from the time t2, the latch signal LC becomes low level, whereby the latch state of the address latch circuit 201 is released. The address ADD passes through the address latch circuit 201 and is outputted as the internal address LADD. At this time, the external address ADD remains defined to be an address An. The internal address LADD is transitioned from the address Ax to the address An. Upon receipt of this transition of the internal address LADD, the one-shot pulse signal OSP is outputted from the address transition detector circuit 101.

Upon receipt of a falling edge of the latch signal LC, the reset pulse generator circuit 205 generates the signal LC2, and the one-shot pulse generator circuit (OS) 205D generates a signal LC3. Upon receipt of this signal LC3, the multiplexer 204B of the timing adjuster circuit 204 selects the one-shot pulse signal OSP having been by-passed through the delay circuit 204A, and outputs the one-shot pulse signal LCOS. Upon receipt of the one-shot pulse signal LCOS, the latch signal LC is outputted from the latch signal generator circuit 206.

The one-shot pulse signal OSP is by-passed through the delay circuit 204A and promptly outputted from the multiplexer 204B as the one-shot pulse signal LCOS. After the internal address LADD is defined to be the address An, then the latch signal LC is promptly outputted and the address ADD is correctly latched again. The latch signal LC is then delayed by the inverter chain 206H, and supplied as the signal REN to the gate circuit 103. Upon receipt of this signal REN, the multiplexer 103A selects the address An for supplying the same to the row decoder.

At a time t5 being after the internal address has been defined, if the latch signal LC becomes low level, then no transition of the internal address LADD is caused, whereby the one-shot pulse signal OSP and the one-shot pulse signal LCOS are not generated. After a predetermined time has past from the time t5, a signal LC1 is generated by the reset pulse generator circuit 207, whereby the refresh disable signal RESTP is reset to be low level, so as to return the state into the initial state, where the refresh is allowed.

As described above, in accordance with the circuit system shown in FIG. 2, even if the address Ax is latched erroneously in the skew time period, then the latch signal LC is promptly generated and the correct address is taken for read operation, provided that the address An for releasing the latch state of the address latch circuit 201 is different from the address Ax as latched.

Operations of the semiconductor memory device shown in FIG. 1 in accordance with the first embodiment will be described with reference to FIGS. 4–8 by focusing to the operation in the page mode, where the high rate read operation is made by switching the column address.

(A) Standard Operation

FIG. 4(a) is a timing chart describing the standard read operation by switching the column addresses A0, A1. In this example, a skew time period is defined from a time t41 to a time t42. All addresses have been defined until the address is latched.

In this drawing, at the time t41, the upper address ADDU and the lower address ADDL are switched. The upper address ADDU is defined to be an address A40 at the time t42 when the address skew time period is ended. A circuit system for the lower address ADDL is non-synchronously operated. The address ADDL is promptly defined to be an address A401 at the time t41 without any skew.

At the time t42 when all addresses are finally defined, the read operation to the top address in the normal mode is started. For each data terminal, data D1~D4 of 4-bits designated by addresses A40, A401 are read out in parallel from the memory cell array 106 and then held in a data latch circuit 110. Only a datum D1 is selected by the multiplexer 111 and fed out to the outside.

Thereafter, the operation is made in the page mode. Namely, the lower address ADDL (the column addresses A0, A1) is sequentially switched non-synchronously to addresses A402, A403 and A404. If only the column addresses are transitioned, data held in the data latch circuit 110 are fed out sequentially and non-synchronously, and data D2, D3, D4 corresponding to a subsequent address to the top address are selected by the multiplexer 111 and then fed out sequentially and non-synchronously.

Only the lower address ADDL is non-synchronously switched for read operation in order to suppress the skew to be extremely small, thereby allowing a high rate read operation of the data D2~D4 in a short cycle.

FIG. 4(b) is a timing chart describing read operations by switching only the column address A0. In this example, the skew time period is defined from he time t41 to the time t42. All addresses have been defined until the address is latched. Similarly to the example shown in FIG. 4(a), at the time t41, the upper address ADDU and the lower address ADDL are switched the upper address ADDU is defined to be the address A40 at the time t41. In this example, at the time t41, both the column addresses A0, A1 become high level, whereby the lower address ADDL is defined.

After all addresses are defined at the time t42 of the end of the skew time period, then the internal address IA is defined, whereby the data D1 are selected by the multiplexer 111 and then fed out to the outside. Thereafter, the operation in the page mode is made. Namely, only the column address A0 is transitioned to the low level, whereby the clock generator circuit 109 shown in FIG. 1 generates a clock signal, whereby the internal address IA outputted from the internal address generator circuit 108 is incremented. The multiplexer 111 receiving this internal address selects the data D2 held in the data latch circuit 110 and feeds the same to the outside. Upon the transition of the column address A0, then the data D3 and D4 are sequentially fed out to the outside.

A clock generator circuit 109 is reset by the latch enable signal LE every times the read operations in the normal mode, so that the clock generator circuit 109 is not operated in defining a start address in the normal mode (operation mode other than the page mode for read operation by switching the column address A0) and in the page mode.

In accordance with this example, except for the top address for read out of the first data D1, only the column address A0 is switched. This means that no substantive skew is present. Accordingly, as compared to the example shown in FIG. 4(a), it is possible to set the read cycle which is shorter.

In this example, the data latch circuit 110 holds four-bits data If the bit number of the data to be held by the data latch circuit 110 is increased, then the transition of the column address A0 only allows the sequential feeding out of all the data held in the data latch circuit 110.

(B) Operations in the Normal Mode with the Long Skew of the Top Address.

Figure 5:
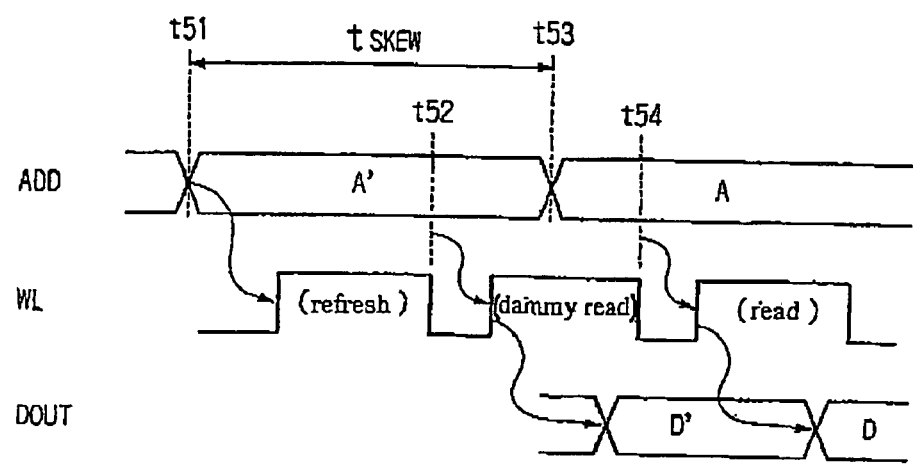
FIG. 5 is a timing chart illustrative of operations of the semiconductor memory device (operations in normal mode free of skew) in accordance with the first embodiment of the present invention.

As shown in FIG. 5, operations will be described wherein the skew time period tSKEW is long, which is defined from a time t51 with transition of the address ADD to a time t53 with definition of the address ADD, and the address has not yet been defined at a time t52 with latching the address. In this case, the above-described circuit system shown in FIG. 2 is effectively functioned, so that as described below, the transition of the externally supplied address ADD during the read operation causes that subsequent to the read operation, a newly supplied external address is taken for conducting the read operation again.

At the time t51, the address ADD is transitioned, then the refresh accompanying to the read operation is started. At the time t52 in the skew time period, the address ADD is latched for read operation for this address. Since at the time t52, the address ADD has not yet been defined, then the indefinite address A' is latched, whereby a dummy read operation is made for the address A' for outputting data D'.

At the time t53 during the dummy read operation, the address ADD is defined to be the address A, whereby the circuit system shown in FIG. 2 is operated according to the above-described timings shown in FIG. 2. At a time t54 with the end of the dummy read operation, the address A is again latched The read operation is made for this address A and the data D are outputted. Namely, a judgment on whether a re-read operation is necessary is made at the time t54, depending upon the issue of whether or not the address ADD was transitioned or defined during the fist time read operation (the dummy read operation).

An access time tAA on the specification is defined to be a period from the time t53 to a time of having the data D outputted. This access time includes the read and refresh. The refresh is basically similar to the read in time period, for which reason the access time tAA includes two times of the read. As shown in FIG. 5, two times read operations are made, for example, the dummy read operation and the subsequent read operation. At the time t52 prior to the time t53, the first read operation or the dummy read operation is started. A time period from the time t53 to the time of the output of the data D necessarily satisfies the access time tAA on the specification.

Even the skew time period tSKEW of the address ADD is long, then if the address A' latched in conducting the dummy read operation is different from the post-dummy-read-address A, then the address A is latched, whereby the read operation is made for the correct address. In the above-described operations shown in FIG. 4, the skew time period from the time t41 to the time t42 is limited in convenience. Notwithstanding, it is unnecessary to limit the skew of the upper address ADDU on the specification, similarly to the normal SRAM.

In this example, the address ADD is defined during the dummy read. Notwithstanding, even if a series of the dummy read operations is completed during the skew time period tSKEW, the latch operation is repeated until the normal address is latched, provided that the addresses latched after and before the dummy read operation are different from each other.

(C) Operations in Case that the Defined Address Includes any Noise

Figure 6:
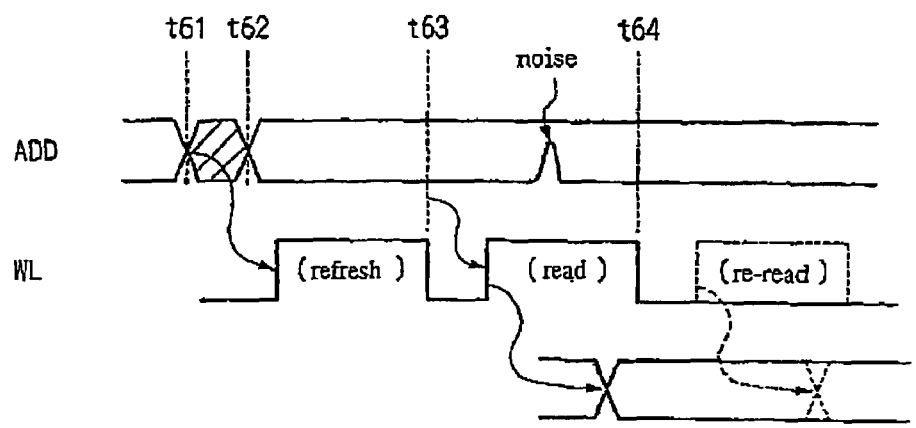
FIG. 6 is a timing chart illustrative of operations of the semiconductor memory device (operations with addresses including noises) in accordance with the first embodiment of the present invention.

Operations will be described wherein as shown in FIG. 6, the address ADD is transitioned at a time t61 and defined at a time t62 and then any noise appears in the address ADD. In this case, the circuit system shown in FIG. 2 is effectively functioned.

Namely, at the time t61, the address ADD is transitioned, and the address transition detector circuit 101 promptly detects this transition for refresh operation. After this refresh operation, at a time t63, the address ADD is latched and taken for subsequent read operation. Even if any noise appears on the address ADD during a period from the time t63 to a time t64 of latching the next address, then the address transition detector circuit 101 does not output any one-shot pulse signal for read operation because the address transition detector circuit 101 is set to be low in sensitivity to noise. Accordingly, the re-read operation is not made upon the noise included in the address. Even if a new read cycle is started after the time t64, then the operation of this cycle is not disturbed.

(D) Operations in the Page Mode Free of any Skew of Address

Figure 7:
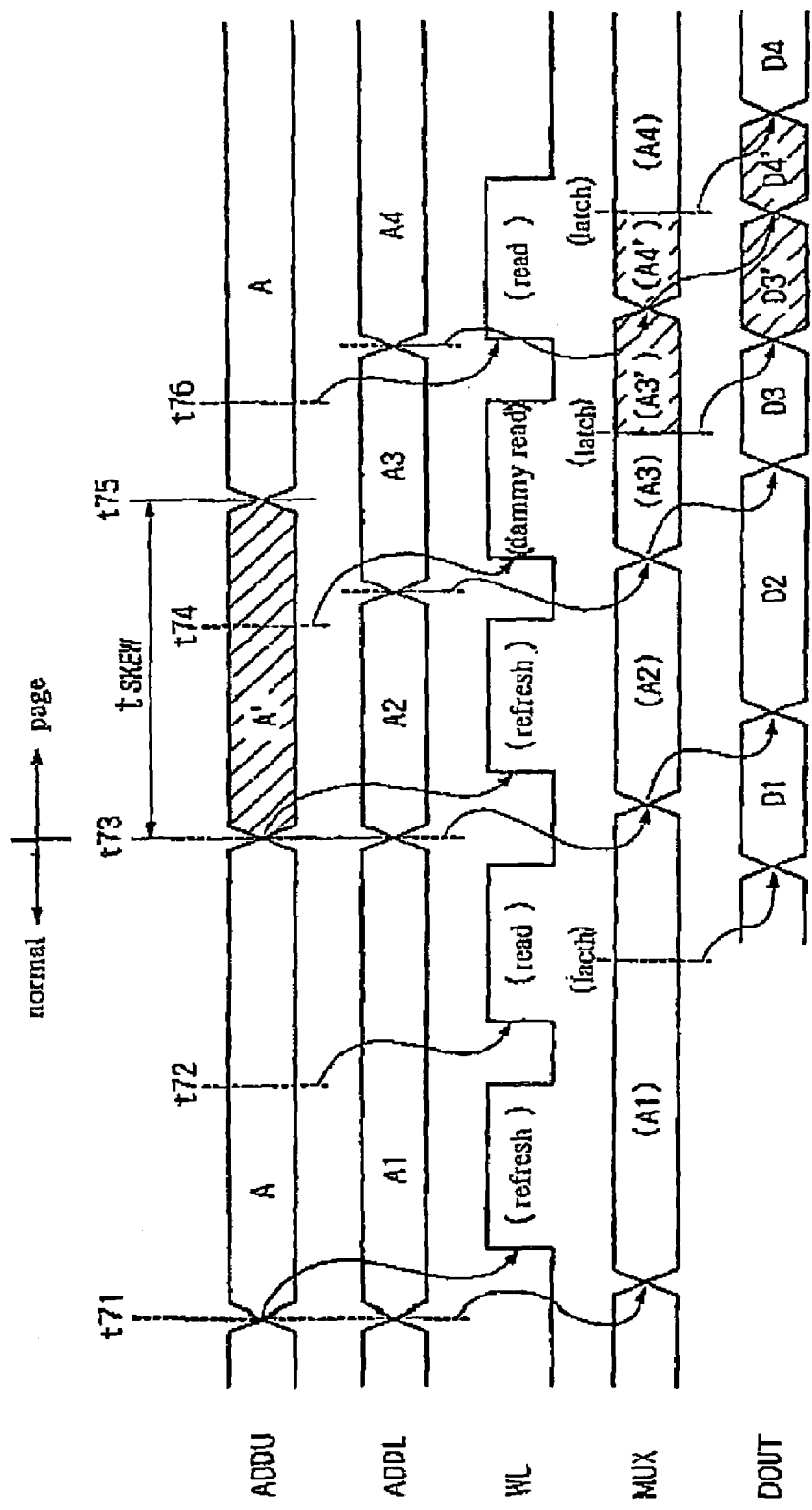
FIG. 7 is a timing chart illustrative of operations of the semiconductor memory device (operations free of skew of page mode) in accordance with the first embodiment of the present invention.

Operations will be described wherein as shown in FIG. 7, the skew time period tSKEW of the upper address ADDU is absent from a time t73 of starting the page mode to a time t75.

At the time t71, the upper address ADDU and the lower address ADDL are transitioned, whereby the refresh is made accompanying to the read operation.

After the refresh is finished, then at a time t72, the address ADD is latched for read operation for this address, thereby outputting data D1. At the time t73, the lower address ADDL is transitioned in sequence of addresses A2, A3 and A4 for read operations in the page mode.

The upper address ADDU should have to be maintained to be the address A after the time t71 and until the read operations in the normal mode and the page mode are completed. If due to any unintended reason, the upper address ADDU is not defined in this time period and if the long skew is generated, then, upon transition of the upper address ADDU at the time t73, similarly to the above-described operations shown in FIG. 5, the refresh and the dummy read are sequentially made. In parallel to these operations, data D2 for the lower address ADDL are read out. After the lower address ADDL is switched to an address A3, then data D3 corresponding to this are outputted.

At a time t74 of finishing the refresh, the upper address ADDU is latched. At this time t74, the address ADDU is indefinite, for which reason the upper address as latched is transitioned. For this reason, a miss-judge that it is the normal mode is made for carrying out the dummy read, whereby during the output of the data D3 from the data latch circuit 110, data D3' corresponding to the address latched at the time t74 are latched by the data latch circuit 110 and then outputted After the lower address ADDL is switched to an address A4, data D4' in the normal mode corresponding to this are outputted following to the data D3'. Namely, the data are temporary outputted, which are different from the data which are expected in the page mode after the time t73.

However, in view of the operation in the normal mode, it may be just considered that data corresponding to the address are outputted and thus this is the normal operation. At a time t75, the upper address ADDU is returned to the original address A, the original upper address ADDU is latched again at a time t76 with finishing the dummy read operation, and the lower address ADDL is switched to an address A4, whereby correct data D$ for this address are then outputted. Accordingly, if the long skew is present in the page mode, erroneous data are temporarily outputted and then the correct data are finally outputted.

In case of the page mode, if the long skew is present on the upper address ADDU, the return of the upper address to the original state causes the correct re-read to obtain the data which are expected to be read out in the page mode. Notwithstanding, it is possible that erroneous data corresponding to the indefinite address in the skew are temporarily outputted. In general, such the long skew time period is so long as the page cycle, for which reason the long skew time period is the unpractical skew for the system operated in the page mode. Accordingly, the presence of the long skew in the page mode causes that the erroneous data are temporarily outputted but no substantive problem is raised in the system side, to which the data are entered.

If at the time t73 of sifting the normal mode into the page mode, the upper address ADDU is transitioned, then the refresh is executed because it is possible that the address defined immediately after the address transition is the address designated in the normal mode. For returning the transitioned address into the original address, there are two cases of an entry to the page mode and of another entry to the normal mode where only the same lower address as the page mode is transitioned. In case of the entry into the page mode, a possibility of generating a large skew is low. In case of the entry into the normal mode, the possibility is high. Accordingly, in order to ensure the correct operations in either entry case, it is necessary to perform the refresh upon transition of the address, thereby allowing that the refresh is generated at the normal timing or the read operation in the page mode is continued.

(E) Operations in the Page Mode with a Short Address Skew

Figure 8:
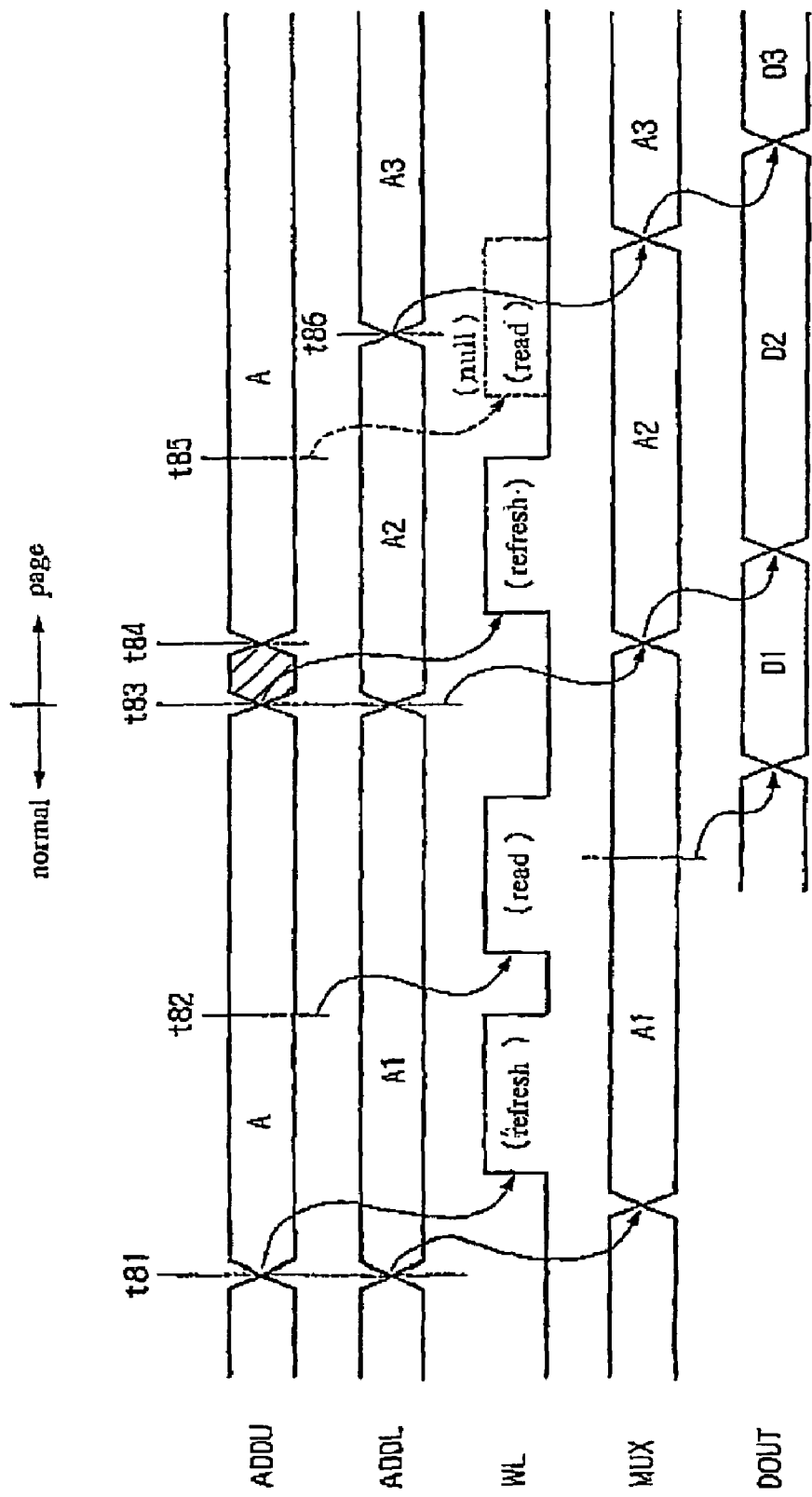
FIG. 8 is a timing chart illustrative of operations of the semiconductor memory device (operations with a short skew of page mode) in accordance with the first embodiment of the present invention.

Operations will be described in case that as shown in FIG. 8, a skew time period tSKEW is short (short skew) of the upper address ADDU defined from a time t83 of starting the page mode to a time t85.

In this case, the operation depends on the issue of whether the short skew is detected by the above-described address transition detector circuit 101 and the one-shot pulse signal OSP for the read operation is generated.

In a case that the short skew is such as not detected by the address transition detector circuit 101, then only the refresh is started. At the time t85, the operation in the page mode is judged and the normal read is not executed. In parallel to is, data D2 corresponding to the lower address A2 are outputted from the data latch circuit 110. At a time t86, the lower address ADDL is defined to be an address A3, whereby data D3 corresponding to this are then outputted. Accordingly, the read operation is executed in the page mode without rising any problem In another case that the short skew is such as detected by the address transition detector circuit 101 and the address latch is maintained immediately before the time t85 of the address latch, then the normal read operation is started following to the refresh operation. In this case, however, a newly taken external address is compared to the latched address. If those addresses are the same as each other, then the read operation for the newly taken address is made null, and data D2 for the lower address A2 are outputted from the data latch circuit 110. Accordingly, the read operation in the page mode can be executed without rising any problem.

Even illustration is not made, in still another case that at the time t85, the upper address ADDU is defined to be a different address from the address A, then this upper address is latched at the time t85. The read operation in the normal mode for this upper address is started, and new data are outputted from the data latch circuit 110 according to the lower address ADDL Accordingly, in this case, the same access time as the normal mode is satisfied.

If the upper address ADDU is transitioned at the time t83 of shifting the normal mode into the page mode, then the refresh is executed because similarly to the above-described case shown in FIG. 7, it is possible that the address defined immediately after the address transition is the address to be designated in the normal mode.

The descriptions of the first embodiment have been made above.

In accordance with this first embodiment, a plurality of data read out in parallel from the memory cell array are latched by the data latch circuit 110 and then outputted from this latch circuit non-synchronously in accordance with the column addresses, so as to set a cycle in the page mode without consideration of the skew. Thus, an improvement in the read rate in the page mode can be obtained.

Further, it is possible that only the least significant column address is switched to output the data latched by the latch circuit non-synchronously for further shortening the cycle in the page mode.

If the upper address is different between before and after the dummy read started by the skew, then the address is again latched to make it unnecessary to limit the skew on the specification, and thereby allowing the pseudo-SRAM to perform the skew-free operation.

As compared to the case of starting the refresh, the sensitivity of the address transition detector circuit for storing the read operation is lower, thereby preventing any erroneous operation to the noises included in the address.

Second Embodiment

A second embodiment in accordance with the present invention will be described hereinafter.

Figure 9:
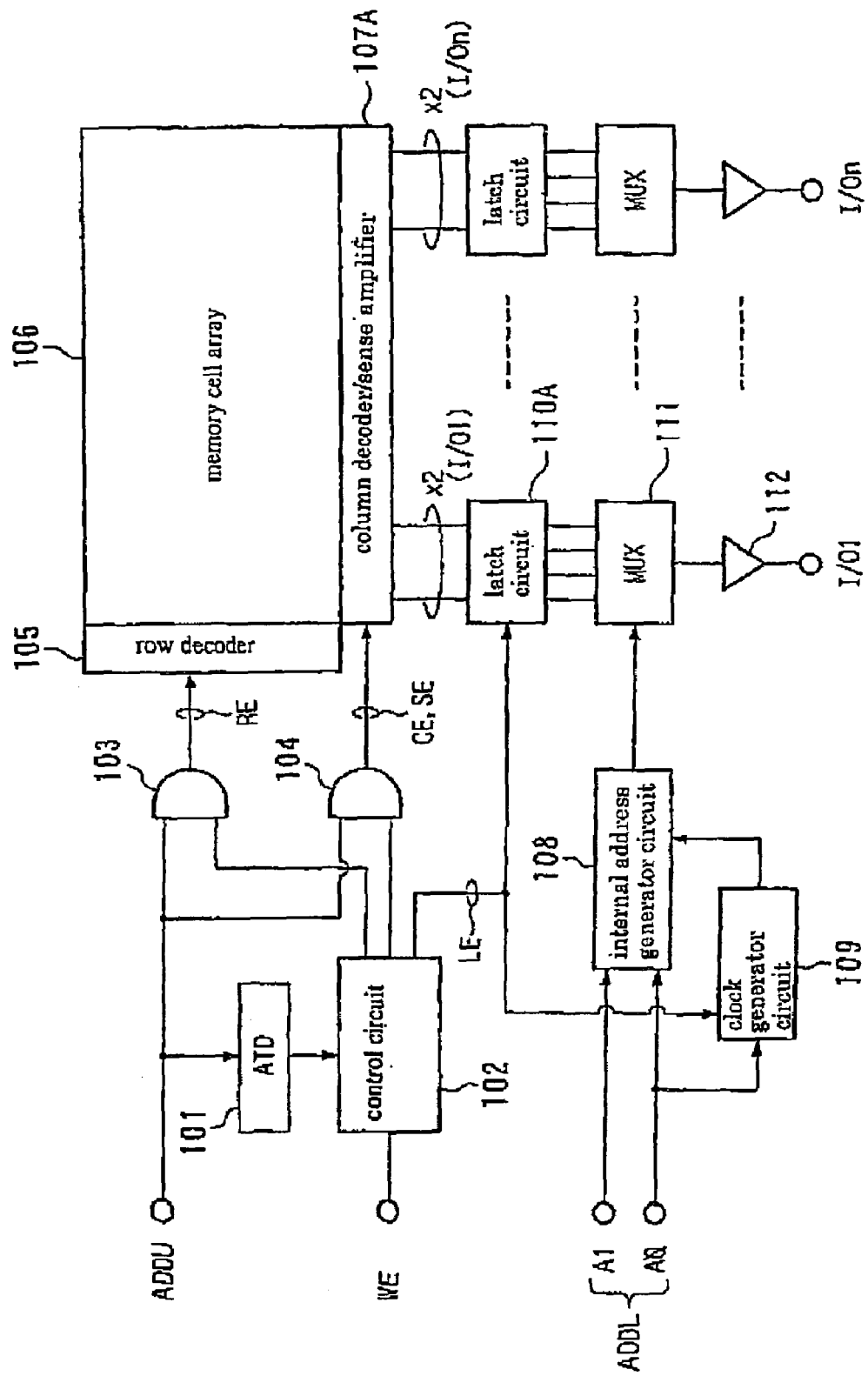
FIG. 9 is a block diagram illustrative of a configuration of a semiconductor memory device in accordance with a second embodiment of the present invention.
Figure 10:
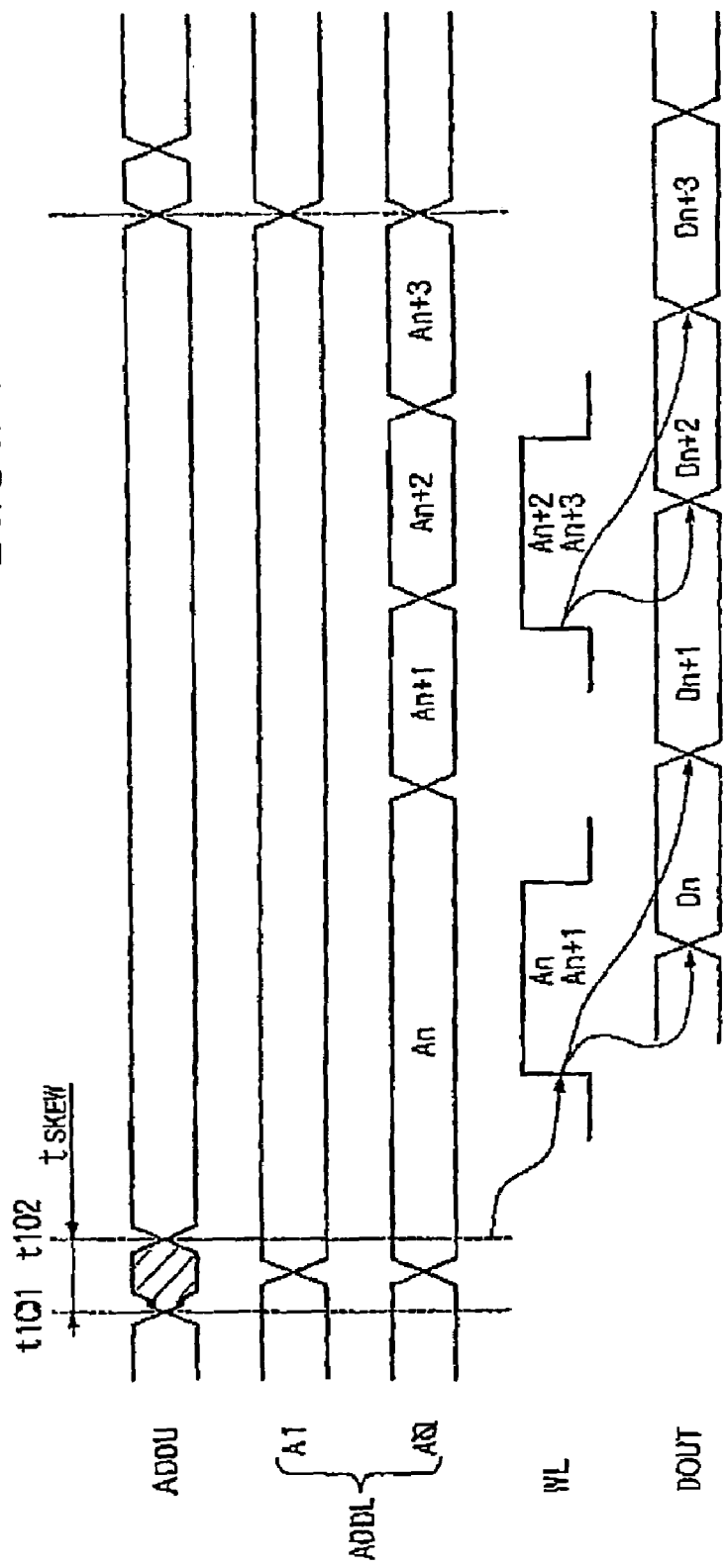
FIG. 10 is a timing chart illustrative of operations of the semiconductor memory device in accordance with the second embodiment of the present invention

A semiconductor memory device according to this second embodiment is the same in configuration as the above-described first embodiment, except that as shown in FIG. 9 that two times of data transfer in 2-bits unit are made in time-division from a column decoder/sense amplifier 107A to a data latch circuit 110A Operations of this second embodiment will be described with reference to FIG. 10.

Through a skew time period tSKEW from a time t101 to a time t102, the upper address ADDU an the lower address ADDL are defined. Bit lines are selected which are designated by both an address designated to be a column address A0 of the lower address and a next column address An+1. 2-bits data Dn, Dn+1 appearing on those bit lines are read in parallel. Those 2-bits data are latched by the data latch circuit 110A and fed out to the outside sequentially and non-synchronously in accordance with the externally designated column address A0.

In parallel to the read operation of the above-described 2-bits data Dn, Dn+1, at an appropriate timing, other 2-bits data are read out, which are designated by both the address An+1 designated as the address A0 and a next address An+2 and the other 2-bits data are then latched by the data latch circuit 110A and outputted.

The addresses An~An+3 designated by the column address A0 are sequential addresses, for which reason designation of the top address An causes an internally automatic generation of the other addresses. The read operations for the 2-bits unit are executed in time-division in accordance with those addresses.

In accordance with this second embodiment, it is possible to reduce the scale of the bus for data transfer between the column decoder/sense amplifier 107A and the data latch circuit 110A. In this example, a bus for 2-bits should be provided for a single data output terminal. This means it possible to allow a half-reduction of the number of the buses as compared to the above-described first embodiment. For example, if the number of the data output terminals is 16, then in the above-described embodiment, 64 of buses (4 bits by 16) are necessary, while in this second embodiment 32 of buses are necessary.

Even illustration is not made, if the address A0 is transitioned at a time when the normal mode is shifted to the page mode by transition of the column address A0 from the address An to the address An+1, then the refresh is executed because similarly to the cases shown in FIGS. 7 and 8, it is possible that the address defined immediately after the address transition is an address designated in the normal mode.

Third Embodiment

A third embodiment of the present invention will hereinafter be described.

A semiconductor memory device in accordance with this third embodiment is to realize write operations in the page mode.

The circuit configuration is such as comprising a data latch circuit for taking and holding a plurality of data externally designated in a plurality of cycles defined by column addresses as the lower addresses, respectively, and a write control system for performing a batch-write operation of all data as taken into the data latch circuit into memory cells.

Operations of this third embodiment will be described with reference to FIG. 11.

Through a skew time period tSKEW from a time t111 to a time t112, an address for a time period T1 is defined. In this time period T1, at a time t113, the write enable signal /WE becomes low level, and at a time t115, the write enable signal becomes high level. Data D1 are taken and written into the memory cell at a rising edge to the high level of the write enable signal /WE. In subsequent time periods T1~T4, the column address A0 is switched, and the column address is sequentially incremented. Similarly to the time period T1, in each tie period, the data are written into the memory cells.

In the page mode (only the lower address is transitioned), the word line is selected one time in the same cycle for write operation only for preventing refresh operation. This reduces the cycle time into a half of that in case that the word line is selected two times in the normal mode, thereby allowing a high rate and continuous write operation in the page mode. During the write operation, no refresh is executed. In a subsequent normal mode, the refresh is enabled. For this reason, there is no problem with storing data unless the page mode is continued for a long time.

Operations of this third embodiment will be described with reference gain to FIG. 11.

Through a skew time period tSKEW from the time t111 to the time t112, the address for the time period T1 is defined. In this example, at the time t112, the column address A0 of the lower address ADDL is defined at the high level. In this time period T1, at the time t113, the write enable signal /WE becomes low level, and at the time t114, the write enable signal /WE becomes high level. Data D1 are defined as data DIN from the time t114 to a time t116 before and after the rising edge of the write enable signal /WE. At a time t115 when the data DIN are defined to be the data D1, the write enable signal /WE becomes high level, whereby the data D1 are taken into the data latch circuit.

After the time t115, the data are taken in the page mode for writing the same into the memory cells. Namely, at the time t115 when this time period T2 starts, the column address A0 becomes low level, and data D2 corresponding to the address designated in the time period T2 are taken into the data latch circuit at the rising edge of the write enable signal /WE. In subsequent time periods T3 and T4, data D3 and D4 are taken into the data latch circuit similarly to the above description. Consequently, through the time periods T1~T4, external 4 bits data D1~D4 are sequentially taken and accumulated in the data latch circuit In the time period T4 as the last cycle, the final data D4 are taken into the data latch circuit, and then the 4-bits data accumulated in the data latch circuit are batch-written into the memory cells designated by the addresses designated in the respective time periods.

In the time periods T1~T3, the external data are simply taken into the data latch circuit, for which reason it is possible to shorten those time periods T1~T1. In the last time period T4, it is necessary to allocate a necessary time in order that the 4-bits data are written into the memory cells, for which reason. In accordance with this write method in the page mode, only the last cycle is set long for shortening a total of the cycles for write operations, thereby effectively shortening the write time.

The following operations are also possible other than the above, described operations.

Figure 11:
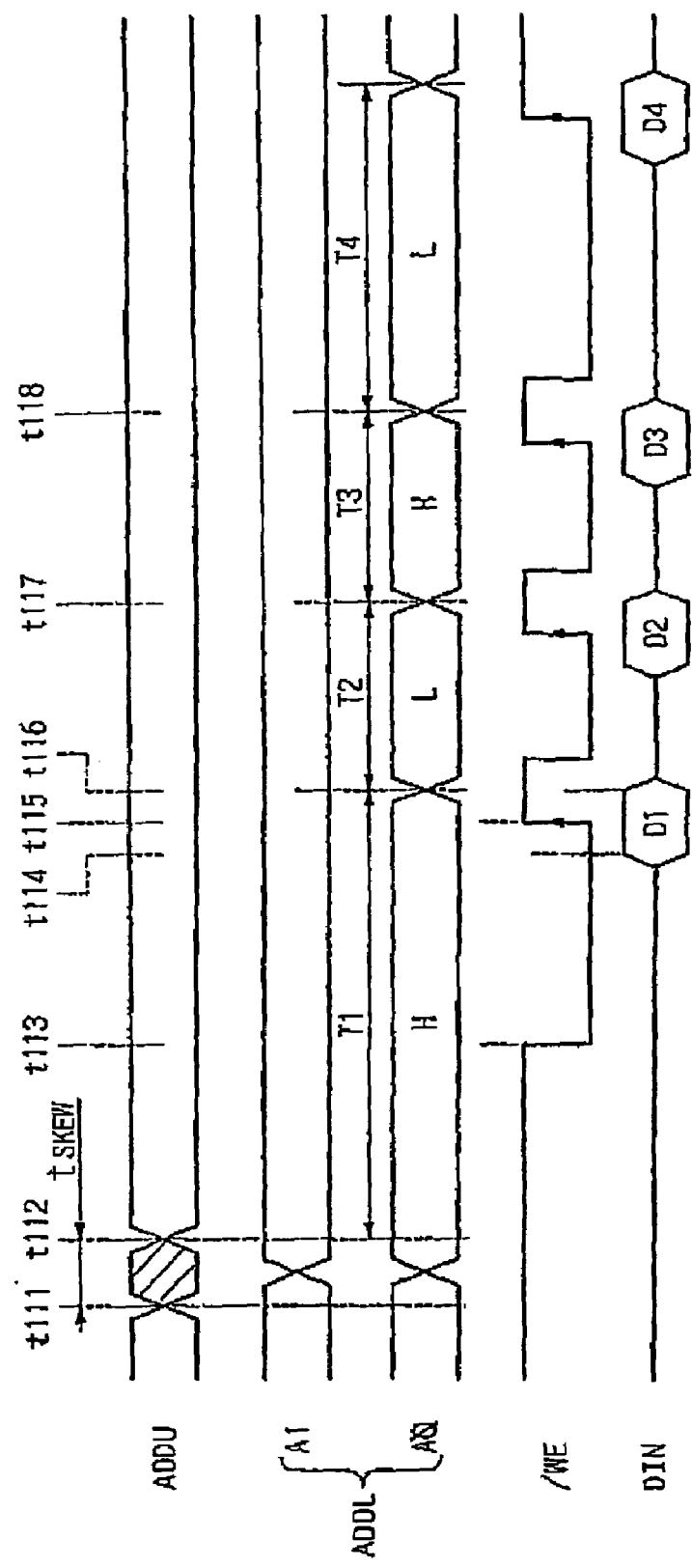
FIG. 11 is a timing chart illustrative of operations of the semiconductor memory device in accordance with a third embodiment of the present invention.

For the operations shown in FIG. 11, it is possible that in the cycles T1~T3, the data are simply taken, and the refresh operation is, if any, started from the time period T1 through the time periods T2 and T3, provided that in the time period T4, data for four times are batch-written into the memory cells. In the normal mode, the cycle T1 is long, wherein the write operation is executed one time. The issue of whether it enters into either state is unknown at the time of the address transition in the time period T1. For this reason, the device remains in the refresh enable state, during which the judgment is made on the write enable signal /WE and the address transition. For example, if the lower address only is transitioned in the short cycle, while the write enable signal is the short pulse, then the judgment of the page mode is made.

Fourth Embodiment

A fourth embodiment in accordance with the present invention will be described.

In the above-described third embodiment data are batch-written in the last cycle of the page mode. In this fourth embodiment, by using a late-write mode, the four-bits data (a plurality of data) taken in the above-described data latch circuit are batch-written in late-write into the memory cells.

Operations of this fourth embodiment will be described with reference to FIG. 12.

After a skew time period from a time t121 to a time t122, similarly to the above-described time periods T1~T3 shown in FIG. 11, data D1~D3 are taken through the time periods T1~T3, whereby those data are accumulated in the data latch circuit. In this embodiment, in the last time period T4, similarly to the foregoing time periods, data D4 are simply taken. Namely, the data D1~D4 are taken into the data latch circuit in short cycles through the time periods T1~T4. Those four-bits data are then written in late-write to the memory cells in a subsequent cycle.

Figure 12:
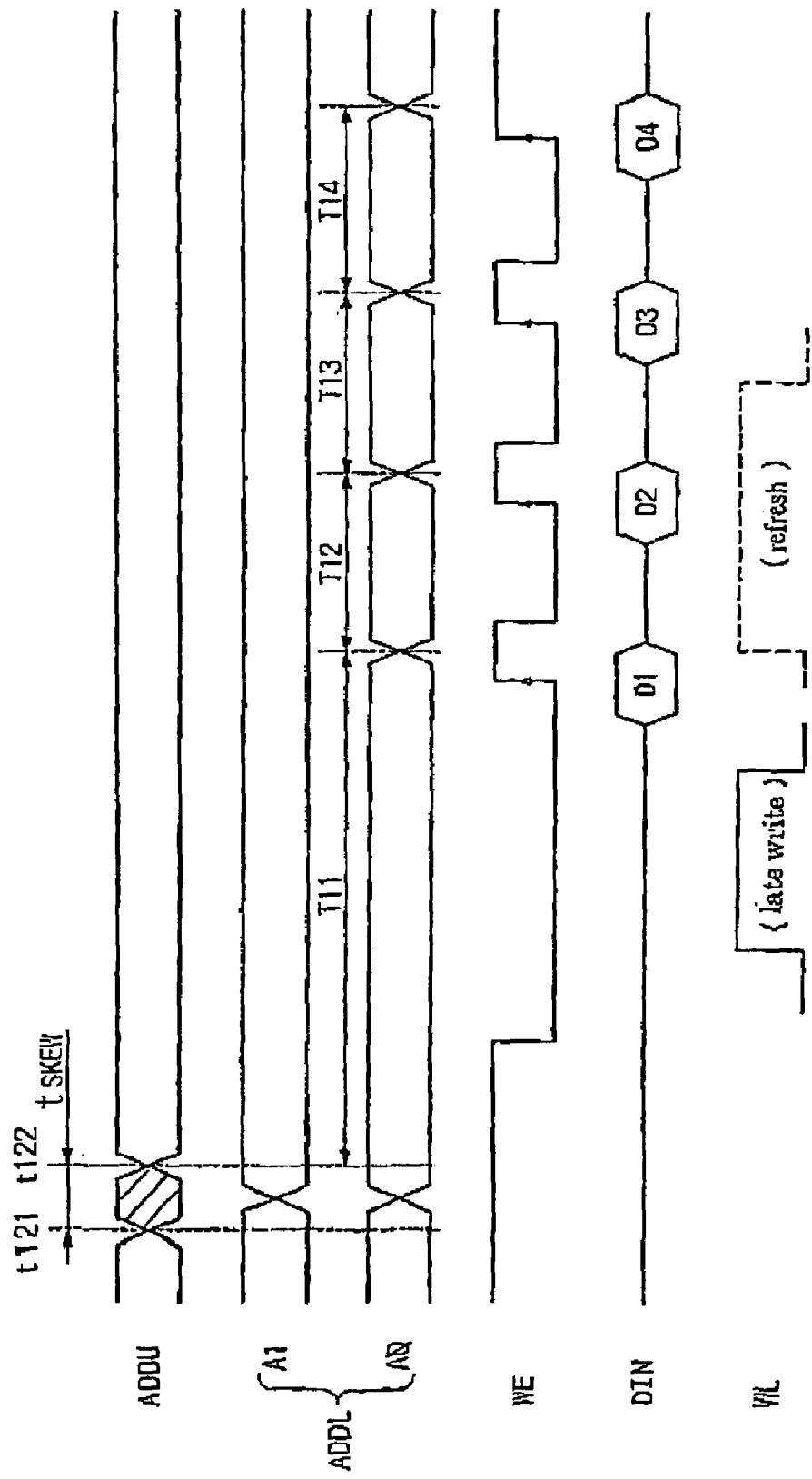
FIG. 12 is a timing chart illustrative of operations of the semiconductor memory device in accordance with a fourth embodiment of the present invention.
Figure 13:
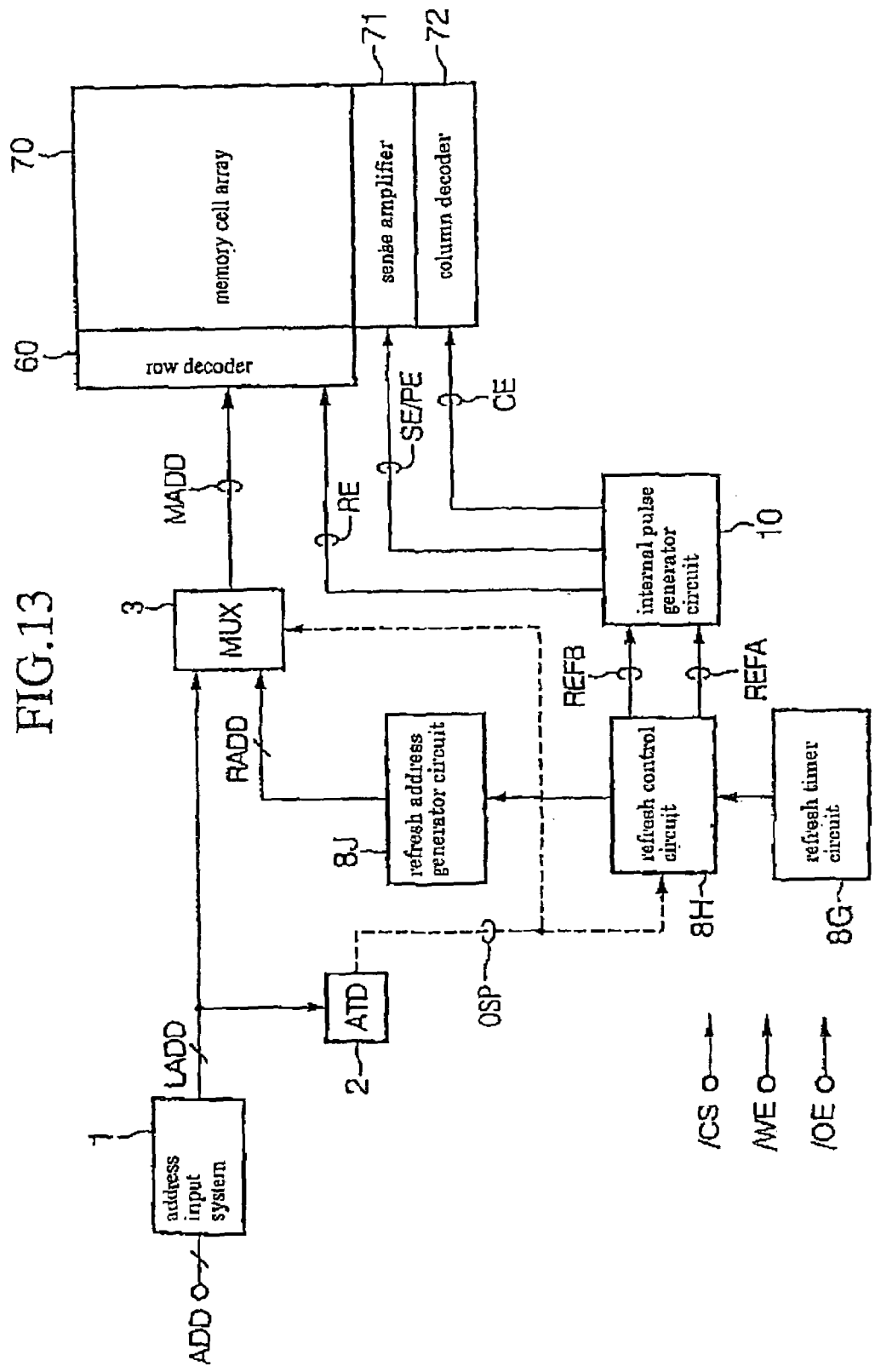
FIG. 13 is a block diagram illustrative of the example of the configuration of the semiconductor memory device of this type.

In an example shown in FIG. 12, the addresses ADDU and ADDL are transitioned from the time t121 through the time t122, whereby the refresh is first executed. The write operation in the time period T11 may be the same as in the normal mode, so as to simnplify the circuit configuration. Subsequent to this refresh operation, in the time period T11, the 4-bits data having already been taken in the data latch circuit in the previous cycle are batch-written in late-write into the memory cells.

The refresh operation is internally executed immediately after the skew time period tSKEW and the subsequent latewrite operation is also internally executed. In the outside, the data are taken from the time period T11 through the time period T14. In this case, the total cycle time is minimum. For example, in at least 8-words-pages, the internal operations (the refresh and the write) can be completed in parallel to the continuous execution in the cycles of taking the minimum data, thereby realizing an operation frequency higher by at least four times than the conventional continuous normal mode. So long as the refresh and the late-write operation are completed, the memory cells are not subject to the read and write operations in the time periods T11~T14, for which reason it is possible to conduct the refresh in those time periods.

In accordance with this fourth embodiment, data having been taken into the data latch circuit in the page mode are then written in late-write in order to shorten the cycle of write operation.

Whereas the respective embodiments of the present invention have been described above, the present invention should not be limited thereto. The present invention includes any design changes within the extent of the subject matter of the present invention. For example, in the above-described embodiments, the four-bits data are held in the data latch circuit 110 and then sequentially selected for output by the multiplexer 111. Notwithstanding, it is also possible that data having been read out from the memory cells are taken into shift registers with parallel/serial conversion function for output thereof.

In the above-described embodiments, data are accumulated in the data latch circuit 110. It is also possible that the column decoder/sense amplifier 107 performs as a latch circuit, so that the data selected by this column decoder/sense amplifier 107 are sequentially and non-synchronously outputted in accordance with the column address.

In the page-write, the write operation may be divided into plural times of the write operations similarly to the read operation.

In accordance with the above-described embodiment, the descriptions are made in case that the internal address is generated in the page mode. This case corresponds to that a burst mode generally so called is realized non-synchronously, the present invention is also applicable in case that the address entry is made in clock input which is operated only in the burst mode and non-synchronously.

INDUSTRIAL APPLICABILITY

As described above, in accordance with the present invention, plural bits data having been read out from the memory cell array are held and non-synchronously selected for sequential output thereof. Even the configuration is of the pseudo-SRAM, it is possible to effectively relax the limitation to the address skew for improving the read operation rate.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A semiconductor memory device configured to read out data from a memory cell connected to a bit line by triggering a transition of an address externally supplied, said semiconductor memory device including:

a hold circuit for reading out and holding, in a read mode, a plurality of data from memory cells designated by a row address and a part of a column address included in said address;

an input output control circuit for sequentially and non-synchronously feeding out said plurality of data held based on remaining addresses other than both said row address and said part of said column address; and a control circuit that controls a second read operation based on a determination of whether said row address and said part of said column address correspond to an indefinite address that was provided during a first read operation.

2. A semiconductor memory device configured to read out data from a memory cell connected to a bit line by triggering a transition of an address externally supplied, said semiconductor memory device including:

a hold circuit for reading out and holding, in a read mode, a plurality of data, from memory cells designated by a row address and a part of a column address included in said address;

an input output control circuit for sequentially and non-synchronously feeding out said plurality of data held based on remaining addresses other than both said row address and said part of said column address; and a control circuit for starting a read operation based on said row address and said part of said column address after a predetermined time has past from an external supply of said row address and said part of said column address, wherein said control circuit starts a read operation based on a row address and a part of a column address newly taken at a timing prior to said predetermined time if said row address and said part of said column address were transitioned during said read operation.

3. The semiconductor memory device as claimed in claim 2, wherein said control circuit compares said row address newly taken and said part of said column address newly taken to said row address previously taken and said part of said column address previously taken, and renders null said newly taken row address and said part of said newly taken column address if those addresses are identical with each other.

4. The semiconductor memory device as claimed in claim 1, wherein said input output control circuit includes:

a multiplexer for selecting one of said plurality of data held by said hold circuit; and a switch control circuit for non-synchronously switching a selection state of said multiplexer based on said remaining addresses.

5. The semiconductor memory device as claimed in claim 1, wherein said hold circuit takes in time-division said plurality of data having read out from said memory cells, based on said remaining addresses.

6. The semiconductor memory device as claimed in claim 1, wherein if only said remaining addresses are transitioned in a write mode, than a plurality of data are externally taken in a plurality of cycles defined by said remaining addresses and then held in said hold circuit, and said plurality of data as held are respectively written in said memory cells in a last cycle of said plurality of cycles.

7. The semiconductor memory device as claimed in claim 1, wherein if only said remaining addresses are transitioned in a write mode, then a plurality of data are externally taken in a plurality of cycles defined by said remaining addresses, and said plurality of data as held are respectively written in said memory cells in late-write.

* * * * *